(12) United States Patent
Gopal et al.

(10) Patent No.: US 6,887,732 B2
(45) Date of Patent: May 3, 2005

(54) MICROSTRUCTURE DEVICES, METHODS OF FORMING A MICROSTRUCTURE DEVICE AND A METHOD OF FORMING A MEMS DEVICE

(75) Inventors: Vidyut Gopal, Santa Clara, CA (US); Jeffrey D. Chinn, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/850,951

(22) Filed: May 7, 2001

(65) Prior Publication Data

US 2002/0163051 A1 Nov. 7, 2002

(51) Int. Cl.[7] ............................................. H01L 21/00
(52) U.S. Cl. ......................................... 438/50; 438/48
(58) Field of Search ..................... 438/48, 50; 257/414, 257/415

(56) References Cited

U.S. PATENT DOCUMENTS

| | | |
|---|---|---|
| 5,072,288 A | 12/1991 | MacDonald et al. |
| 5,149,673 A | 9/1992 | MacDonald et al. |
| 5,198,390 A | 3/1993 | MacDonald et al. |
| 5,285,097 A | 2/1994 | Hirai |
| 5,316,979 A | 5/1994 | MacDonald et al. |
| 5,393,375 A | 2/1995 | MacDonald et al. |
| 5,426,070 A | 6/1995 | Shaw et al. |
| 5,506,175 A | 4/1996 | Zhang et al. |
| 5,536,988 A | 7/1996 | Zhang et al. |
| 5,573,679 A | 11/1996 | Mitchell et al. |
| 5,719,073 A | 2/1998 | Shaw et al. |
| 5,726,073 A | 3/1998 | Zhang et al. |
| 5,846,849 A | 12/1998 | Shaw et al. |
| 5,847,454 A | 12/1998 | Shaw et al. |
| 5,867,302 A | 2/1999 | Fleming |
| 6,012,336 A | 1/2000 | Eaton et al. |
| 6,051,866 A | 4/2000 | Shaw et al. |
| 6,208,013 B1 * | 3/2001 | Suzuki ....................... 257/623 |
| 2001/0054315 A1 | 12/2001 | Aigner et al. |
| 2002/0185469 A1 | 12/2002 | Poblesnik et al. |

FOREIGN PATENT DOCUMENTS

| | | | |
|---|---|---|---|
| DE | 19839122 A1 | 3/2000 | |
| EP | 0501359 A2 | 9/1992 | |
| EP | 1077475 A2 | 2/2001 | |
| EP | 1 077 475 | * 2/2001 | ....... H01L/21/3065 |
| WO | WO 99 36948 A | 7/1999 | |

OTHER PUBLICATIONS

Zhang et al, A RIE process for submicron silicon electromechanical structures, 1992 IOP Publishing Ltd.*

Ohba, Chemical Vapor Deposited Tungsten for Vertical Wiring, Mrs Bulletin 1995.*

"An RIE Process for Submicron Silicon Electromechanical Structures"; Zhang et al.; Transducers, San Francisco; Jun. 24–27, 1991; pps. 520–523.

International Search Report; Serial No. PCT/US02/13704; Applied Materials, Inc.; Jul. 9, 2003; 8 pps.

"A RIE Process for Submicron, Silicon Electromechanical Structures"; Zhang et al.; Oct. 31, 1992; pps. 31–38.

"Chemical–Vapor–Deposited Tungsten for Vertical Wiring"; Mrs. Bulletin; Ohba; 11/95; pps. 46–52.

"SiON/Ta$_2$O$_5$/TiN Gate–Stack Transistor with 1.8nm Equivalent SiO$_2$ Thickness"; Park et al.; Mar. 7, 2001; pps. 381–384.

* cited by examiner

Primary Examiner—Alexander Ghyka
(74) Attorney, Agent, or Firm—Wells St. John PS (57) ABSTRACT

Microstructure devices, methods of forming a microstructure device and a method of forming a MEMS device are described. According to one aspect, a microstructure device includes: a semiconductive substrate; a monolithic microstructure device feature coupled with the semiconductive substrate, and wherein at least a portion of the microstructure device feature is configured to move relative to the semiconductive substrate; and a conductive structure provided directly upon the microstructure device feature.

22 Claims, 7 Drawing Sheets

MICROSTRUCTURE DEVICES, METHODS OF FORMING A MICROSTRUCTURE DEVICE AND A METHOD OF FORMING A MEMS DEVICE

TECHNICAL FIELD

The invention pertains to microstructure devices, methods of forming a microstructure device and a method of forming a MEMS device.

BACKGROUND OF THE INVENTION

Advancements in the field of semiconductor processing have resulted in the development of micro-machining and micro-electromechanics. More specifically, micro-electromechanical systems (MEMS) have been fabricated using semiconductor processing techniques to form electrical and mechanical structures using a given substrate.

For example, some micro-electromechanical systems devices include cantilevers or other microstages of silicon which may be configured to be electrostatically actuated for various applications. Such MEMS devices may be used in exemplary applications including gyroscopes, accelerometers, tunable RF capacitors, digital mirrors, etc.

Exemplary MEMS devices including cantilever structures are described in Zhang and MacDonald, *A RIE Process For Submicron, Silicon Electromechanical Structures*, Cornell University (IOP Publishing Ltd. 1992), the teachings of which are incorporated herein by reference. A process is proposed in this publication for the formation of silicon cantilever beams with aluminum side electrodes for use as capacitor actuators. This prior art method is depicted herein as FIGS. 1–11.

Figure 1:
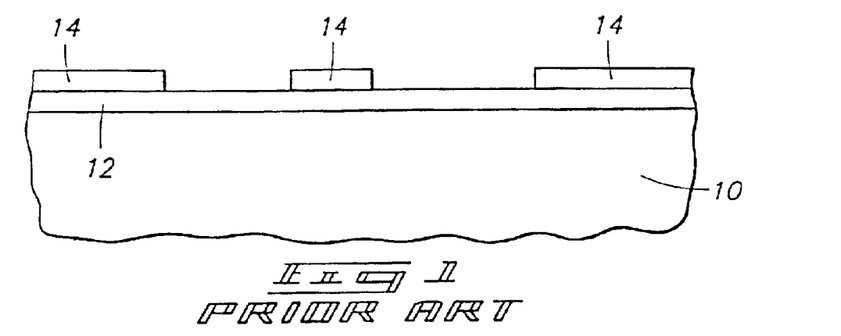
FIGS. 1–11 depict sequential process steps of a conventional fabrication methodology.

Referring initially to FIG. 1, a silicon substrate 10, a silicon dioxide ($SiO_2$) layer 12, and photoresist 14 are depicted. Layer 12 is formed to a thickness of 150 nm and photoresist 14 is patterned as illustrated.

Figure 2:
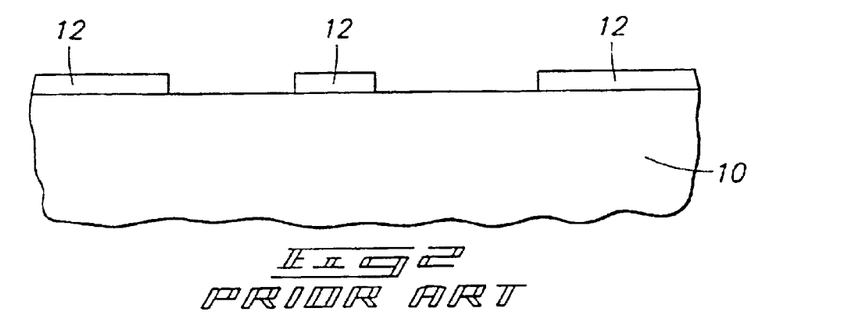

Referring to FIG. 2, a mask defined by photoresist 14 shown in FIG. 1 is utilized to pattern silicon dioxide layer 12.

Figure 3:
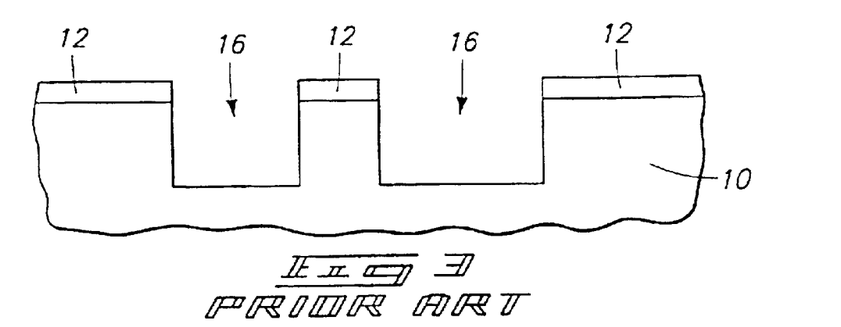

Referring to FIG. 3, plural trenches 16 are formed in substrate 10 utilizing reactive ion etching (RIE) according to the prior art process.

Figure 4:
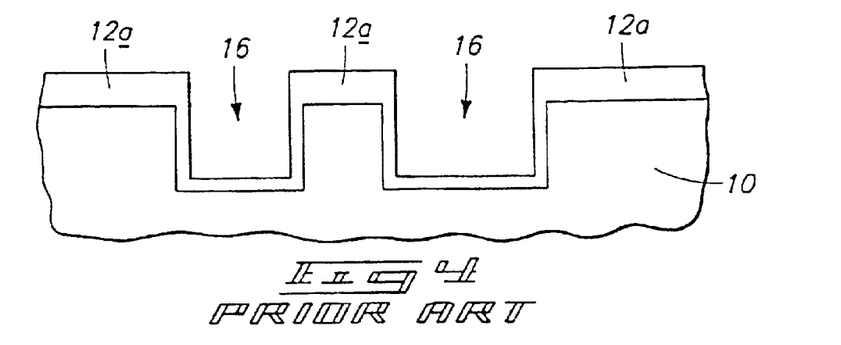

Referring to FIG. 4, thermal oxidation next occurs resulting in insulative layer 12a covering sidewalls and lower surfaces of trenches.

Figure 5:
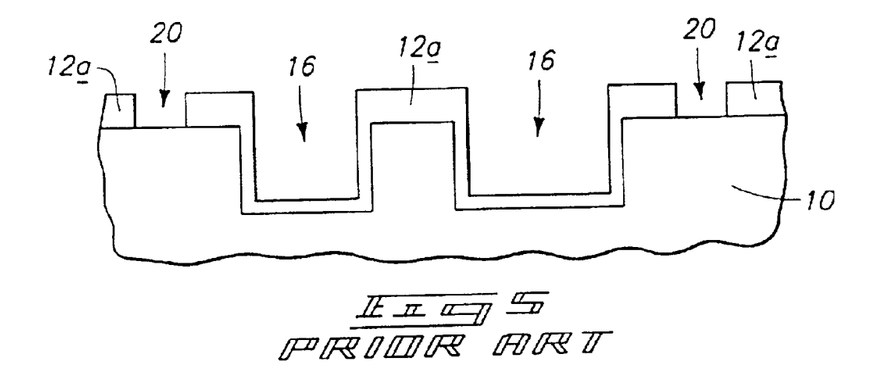

Referring to FIG. 5, contact windows 20 are opened over a surface of substrate 10 to enable desired electrical connection through insulative silicon dioxide layer 12a to substrate 10.

Figure 6:
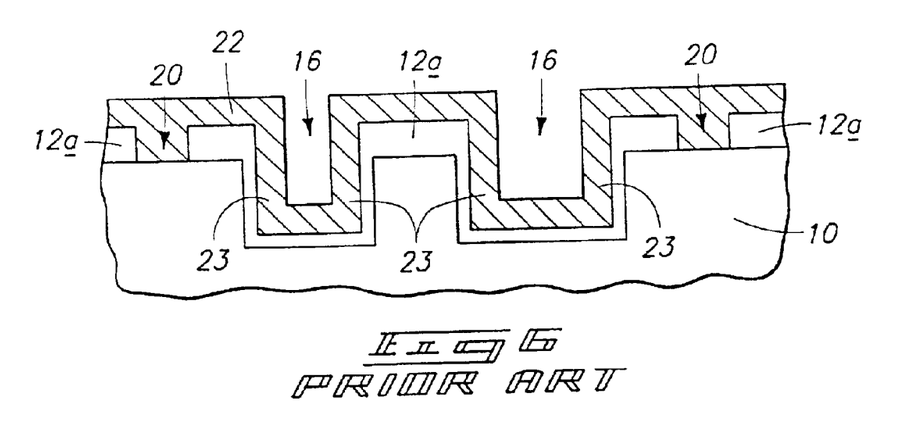

Referring to FIG. 6, an aluminum layer 22 is formed by physical vapor deposition (PVD) to a thickness of 400 nm. The sputtered aluminum layer 22 forms side electrodes 23 within trenches 16.

Figure 7:
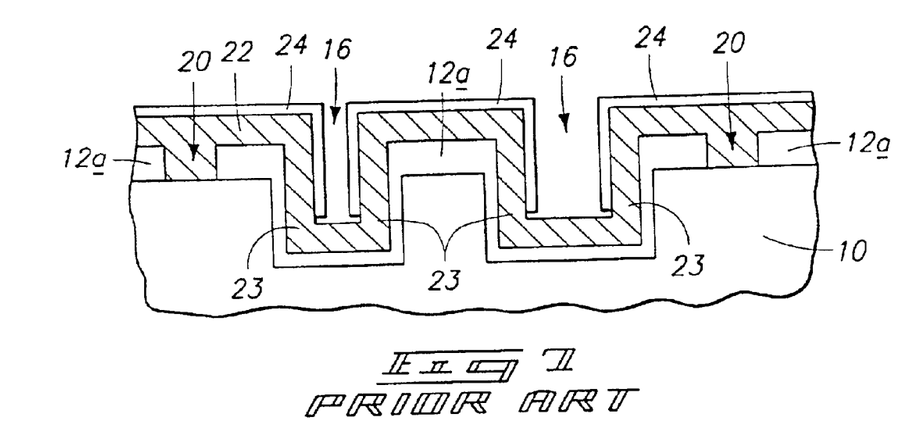

Referring to FIG. 7, photoresist 24 is formed upon the structure of FIG. 6 and is patterned to cover portions of aluminum layer 22 including side electrodes 23.

Figure 8:
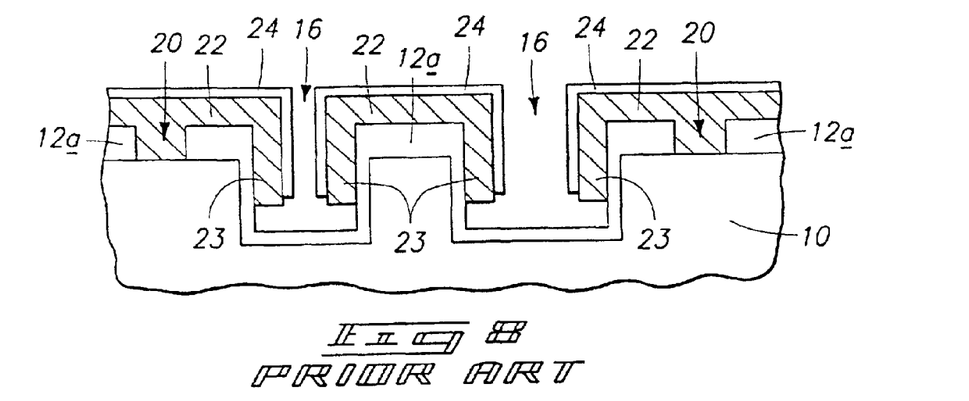

Referring to FIG. 8, portions of the aluminum layer 22 upon the bottom surfaces of trenches 16 are patterned as shown using photoresist 24.

Figure 9:
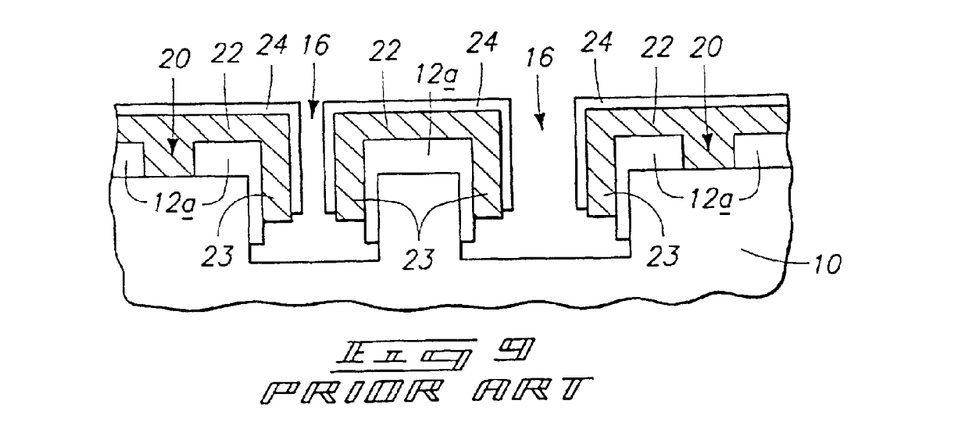

Referring to FIG. 9, portions of silicon dioxide layer 12 within the bottoms of trenches 16 are patterned following patterning of aluminum layer 22.

Figure 10:
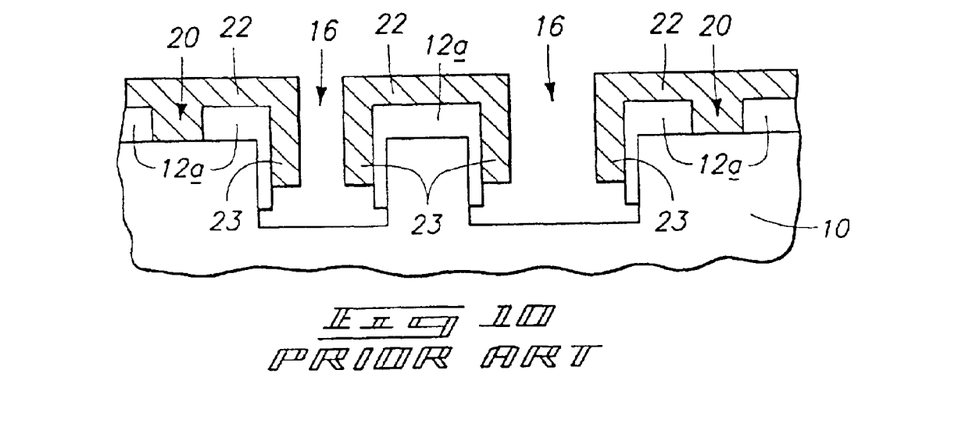

Referring to FIG. 10, photoresist 24 of FIG. 9 is stripped from the structure.

Figure 11:
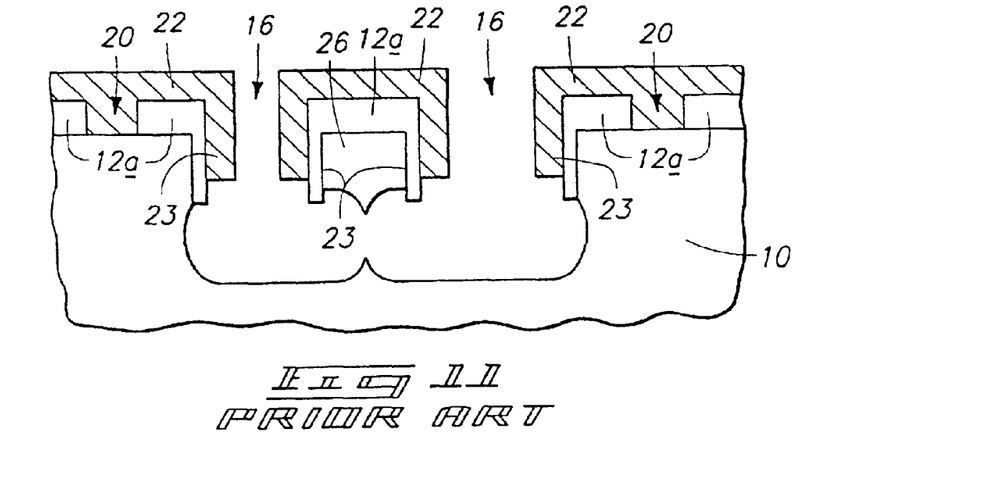

Referring to FIG. 11, a cantilever 26 is released by isotropically etching silicon substrate 10 utilizing a fluorinated plasma (i.e., $SiF_6$). Further details regarding the depicted prior art process are also described in U.S. Pat. No. 5,198,390, the teachings of which are incorporated herein by reference.

Modifications to this aforementioned process have been proposed by M. T. A. Saif and Noel C. MacDonald, as described herein.

In this modified process, the silicon release step described above with respect to FIG. 11 is performed prior to aluminum metallization. More specifically, the silicon is etched similar to FIG. 3 and plasma enhanced chemical vapor deposition PECVD or tetraethylorthosilicate (TEOS) deposition thereafter occurs. The resultant oxide is patterned, the silicon release etch is performed, and aluminum is deposited. This described process eliminates the need to pattern the metal or open contact holes.

The conventional described processes have associated drawbacks. Initially, the reactive ion etching of silicon substrate 10 shown in FIG. 3 typically results in a rough or scalloped etch profile. The roughness is duplicated in subsequent oxide and aluminum layers formed upon the sidewalls of trenches 16. Such roughness or scalloping compromises the functionality of the resultant device inasmuch as the area of the electrodes or capacitor plates is not well controlled. Further, such roughness or scalloping limits the scalability of the structure.

Also, the single crystal reactive etching and metallization process of the prior art contains multiple oxide and aluminum deposition and etch steps resulting in increased complexity.

In addition, the utilization of $SF_6$ plasma to release the silicon cantilever 26 attacks the aluminum side electrodes 23. Although the aluminum is attacked weakly by this chemistry, such may lead to further undesirable non-uniformity of electrodes 23.

Accordingly, there exists a need to provide improved processing methodologies and structures which avoid the drawbacks associated with the prior art methodologies and devices.

SUMMARY OF THE INVENTION

The invention pertains to microstructure devices, methods of forming a microstructure device and a method of forming a MEMS device.

According to one aspect, the invention provides a microstructure device comprising: a semiconductive substrate; a monolithic microstructure device feature coupled with the semiconductive substrate, and wherein at least a portion of the microstructure device feature is configured to move relative to the semiconductive substrate; and a conductive structure provided directly upon at least a portion of the microstructure device feature.

A second aspect of the invention provides a microstructure device comprising: a semiconductive substrate; a microstructure device feature coupled with the semiconductive substrate, and wherein at least a portion of the microstructure device feature is configured to move relative to the semiconductive substrate; and a titanium nitride structure coupled with at least a portion of the microstructure device feature.

Another aspect of the invention provides a microstructure device comprising: a semiconductive substrate having a sidewall; a microstructure device feature having a sidewall adjacent to and spaced from the sidewall of the semiconductive substrate, and wherein at least a portion of the microstructure device feature is configured to move relative to the semiconductive substrate; and opposing conductive electrodes individually provided directly upon one of the sidewall of the semiconductive substrate and the sidewall of the microstructure device feature to form a capacitor.

According to another aspect, a method of forming a microstructure device comprises: forming a monolithic microstructure device feature coupled with a semiconductive substrate; providing a conductive structure directly upon at least a portion of the microstructure device feature; and releasing the microstructure device feature from the semiconductive substrate.

Another aspect provides a method of forming a microstructure device comprising: forming a microstructure device feature coupled with a semiconductive substrate; depositing a conductive structure upon at least a portion of the microstructure device feature using chemical vapor deposition; and releasing at least a portion of the microstructure device feature from the semiconductive substrate.

According to an additional aspect, the invention provides a method of forming a microstructure device comprising: providing a semiconductive substrate; forming a microstructure device feature using the semiconductive substrate and comprising material of the semiconductive substrate; and providing a conductive structure directly upon at least a portion of the semiconductive material of the microstructure device feature; and releasing the microstructure device feature from the semiconductive substrate.

Another aspect provides a method of forming a microstructure device comprising: forming a plurality of trenches within a semiconductive substrate to define a microstructure device feature, the semiconductive substrate and the microstructure device feature having opposing sidewalls; forming respective conductive structures directly upon respective portions of the opposing sidewalls of the semiconductive substrate and the microstructure device feature; and undercutting at least a portion of the microstructure device feature to release the portion of the microstructure device feature from the substrate to permit the portion of the microstructure to move relative to the substrate.

Yet another aspect provides a method of forming a MEMS device comprising: providing a semiconductive substrate; forming plural trenches having bottom surfaces within the semiconductive substrate to define a MEMS device feature between the trenches, the semiconductive substrate and the microstructure device feature having opposing sidewalls; depositing a titanium nitride layer using chemical vapor deposition upon at least a portion of an upper surface of the semiconductive substrate, upon the opposing sidewalls of the semiconductive substrate and the microstructure device feature to form capacitor electrodes, and upon the bottom surfaces; removing the titanium nitride layer upon the bottom surfaces of the trenches; and undercutting at least a portion of the microstructure device feature to release the portion of the microstructure device feature from the substrate to permit the portion of the microstructure device feature to move relative to the substrate.

Other devices and methods are also disclosed herein according to other aspects of the present invention.

BRIEF DESCRIPTION OF THE DRAWINGS

FIG. 21 is a perspective view of an exemplary device embodying aspects of the present invention and fabricated according to the process of FIGS. 12–20.

DETAILED DESCRIPTION OF THE PREFERRED EMBODIMENTS

Exemplary process steps of the present invention are illustrated in FIGS. 12–20 and are described with respect to the formation of microstructure devices. One example of a microstructure device 31 is depicted in FIG. 21 comprising a capacitor actuator of a micro-electromechanical systems (MEMS) device or a microsystems technology (MST) device. Microstructure devices include micromachined components or structures. The depicted microstructure device 31 comprising a MEMS or MST device is exemplary and the present invention may be utilized to fabricate other devices, including other microstructure devices.

Referring to FIGS. 12–20, an exemplary methodology for fabricating features of microstructure devices is illustrated in sequential process steps. Microstructure device feature refers to a micromachined component or structure of a microstructure device configured to move relative to a substrate. One example of a microstructure device feature is a microstage of substrate material comprising a cantilever, gear, valve, actuator, sensor or other structure of a MEMS device.

Figure 12:
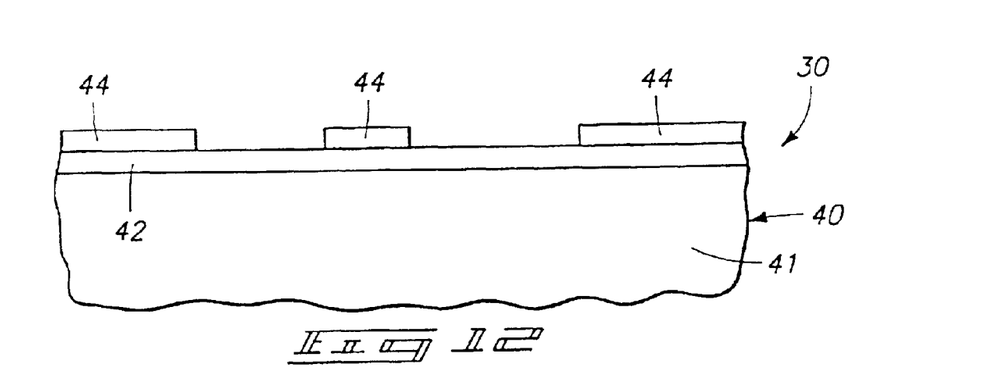
FIGS. 12–20 depict exemplary sequential process steps according to aspects of the present invention.

Referring initially to FIG. 12, a microstructure device assembly 30 is depicted at an initial process step. Assembly 30 includes a substrate 40 comprising substrate material 41 utilized to form subsequent devices. An exemplary substrate 40 is a semiconductive substrate, such as monocrystalline silicon. The present invention encompasses other substrates, materials, and/or layers in addition to monocrystalline silicon, such as polycrystalline or amorphous silicon, silicon carbide, gallium arsenide, for example.

Semiconductive substrate comprises any construction of semiconductive material, including, but not limited to, bulk semiconductive materials such as a semiconductive wafer (either alone or in assemblies comprising other materials thereon), and semiconductive material layers (either alone or in assemblies comprising other materials) including silicon on insulator (SOI) and bonded wafer configurations, for example. Substrate refers to any supporting structure, including, but not limited to, the semiconductive substrate described above.

A layer of insulative material 42, such as thermal silicon dioxide, is formed upon substrate 40 in the depicted embodiment. Further, photoresist material 44 is patterned upon insulative material 42 as illustrated to form a desired microstructure device feature in the subsequent process steps described below.

Figure 13:
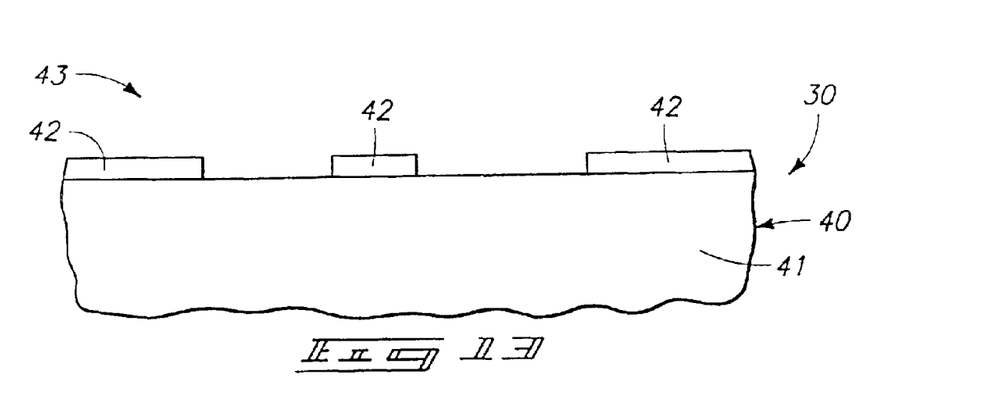

Referring to FIG. 13, the silicon dioxide material 42 is patterned using photoresist material 44 of FIG. 12 forming a mask 43. Photoresist material 44 has been stripped from assembly 30 in FIG. 13.

Figure 14:
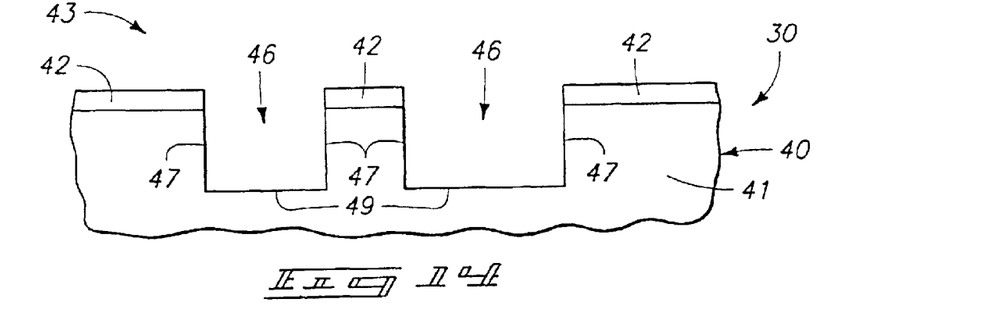

Referring to FIG. 14, a plurality of trenches 46 are formed within substrate 40 as defined by mask 43. Trenches 46 are formed within substrate 40 using reactive ion etching in one example. The depicted trenches 46 are deep trenches individually having a depth of approximately 5–50 microns and a width of approximately 0.25–5 microns. Individual trenches 46 include plural sidewalls 47 and a bottom surface 49.

Figure 15:
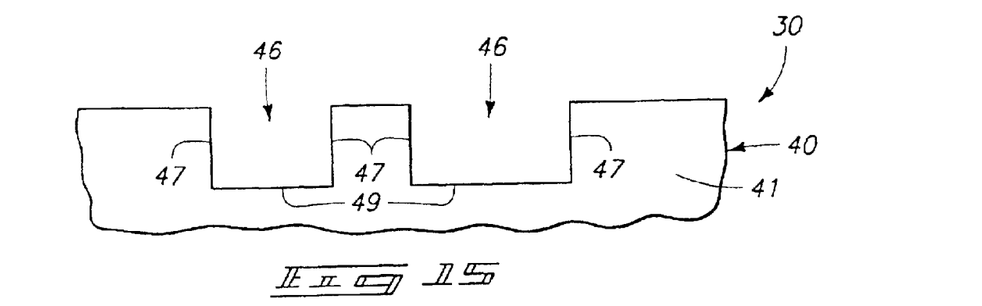

Referring to FIG. 15, mask 43, comprising the insulative material 42, is etched from substrate 40 of assembly 30 following the formation of deep trenches 46.

Figure 16:
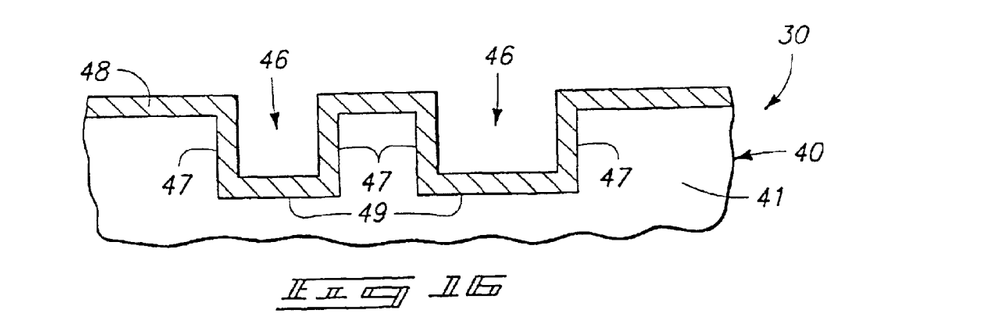

Referring to FIG. 16, a layer of conductive material 48 is provided over substrate 40. According to the described embodiment, conductive material 48 comprises titanium nitride (TiN). An exemplary CVD process of titanium nitride is performed at pressures of approximately 5–10 Torr, temperatures of approximately 680° C., and utilizing the following gases $TiCl_4$ at 350 sccm, $NH_3$ at 100 sccm and nitrogen at 1000 sccm.

Other conductive materials, such as tungsten, tantelum nitride, or other refractory metals, may also be utilized. An exemplary tungsten deposition process is described in Takayuki Ohba, *Chemical-Vapor-Deposited Tungsten for Vertical Wiring*, pp. 46–52 (1995), incorporated herein by reference. Conductive material 48 is selected in accordance with aspects of the invention such that direct deposition of the material upon substrate material 41 will not result in an adverse reaction which compromises device fabrication or operation.

According to embodiments wherein titanium nitride is utilized, the titanium nitride conductive material 48 is deposited in a single layer using chemical vapor deposition (CVD) with $TiCl_4$ as a precursor in the described exemplary process. Conductive material 48 is formed to a thickness of approximately 300 nm in accordance with the illustrative embodiment. Deposition of TiN provides a conformal coating of conductive material 48 having substantially smooth outwardly exposed surfaces even when deposited over a rough substrate, such as sidewalls 47 of individual trenches 46.

Figure 17:
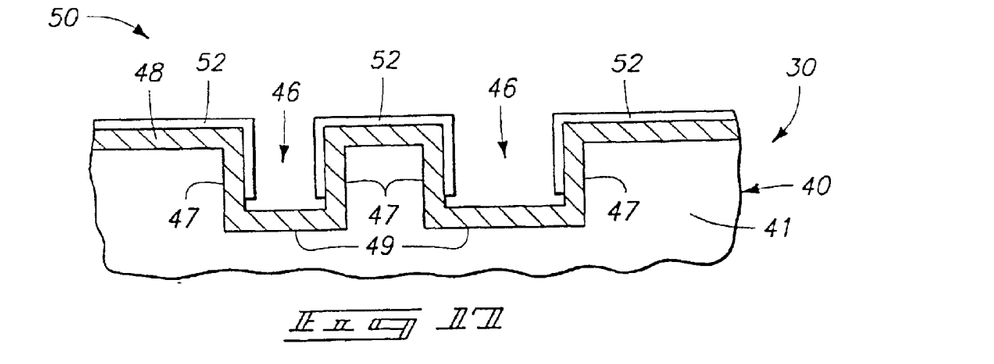

Referring to FIG. 17, a mask 50 of photoresist material 52 is formed upon conductive material 48 of assembly 30 as depicted. The photoresist is deposited and patterned to form the depicted mask 50 over substrate 40.

Figure 18:
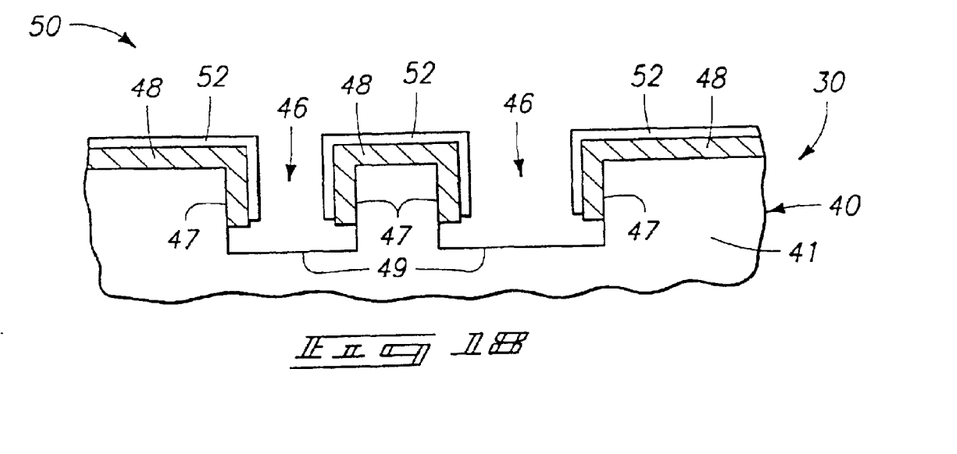

Referring to FIG. 18, conductive material 48 is patterned utilizing mask 50. Such patterning removes conductive material 48 from bottom surfaces 49 and adjacent portions of sidewalls 47 of trenches 46.

Figure 19:
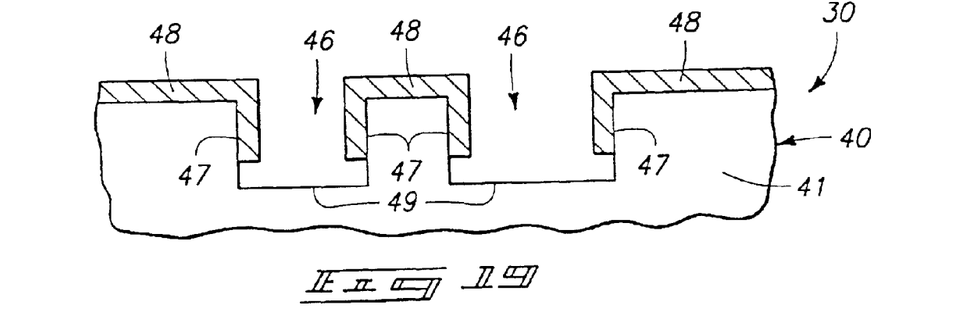

Referring to FIG. 19, photoresist material 52 comprising mask 50 of FIG. 18 has been stripped from assembly 30 leaving remaining conductive material 48 outwardly exposed.

Figure 20:
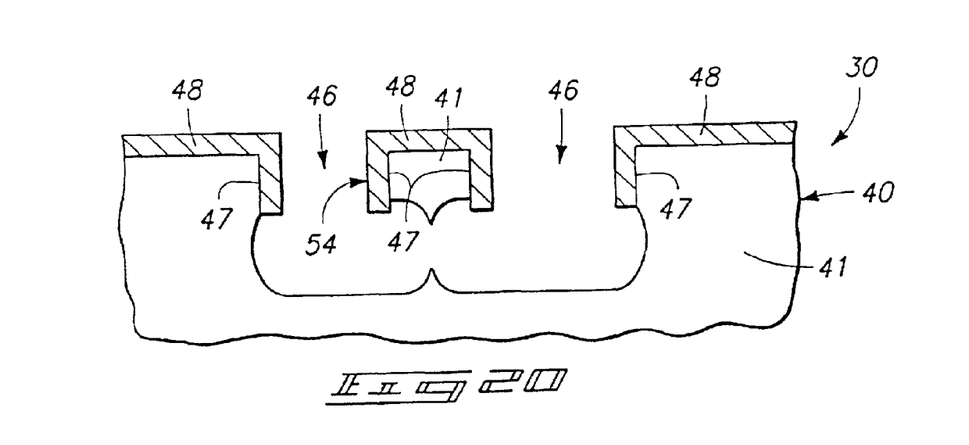

Referring to FIG. 20, substrate material 41 of substrate 40 adjacent to lower portions of trenches 46 is next isotropically etched using conductive material 48 as a mask. A $SF_6$ plasma silicon release etch chemistry is utilized according to one processing methodology to etch substrate material 41. Other etch chemistries are possible including $XeF_2$, for example. The depicted process step releases and defines a microstructure device feature 54 of microstructure device 31. Microstructure device feature 54 is intermediate trenches 46 as shown.

Referring to FIG. 21, further details of assembly 30 comprising microstructure device 31 are illustrated. Microstructure device feature 54 is coupled with substrate 40 and forms a cantilevered extension from substrate 40 in the described exemplary embodiment. Microstructure device feature 54 comprises monolithic substrate material 41 which extends from substrate 40. In the depicted arrangement, microstructure device feature 54 is coupled with substrate 40 at a first end 58 while a second end 60 is configured to move relative to substrate 40. Conductive material 48 is formed directly upon the monolithic microstructure device feature 54 according to aspects of the invention.

As shown, microstructure device feature 54 and substrate 40 have opposing sidewalls 47 adjacent to and spaced from one another. The depicted sidewalls 47 are arranged to face one another intermediate first end 58 and second end 60 of the exemplary microstructure device feature 54. Conductive material 48 is provided directly upon an upper surface 56 and sidewalls 47 of microstructure device feature 54 and directly upon sidewalls 47 and an upper surface 61 of substrate 40.

Conductive material 48 upon sidewalls 47 of substrate 40 define conductive structures 62. Conductive material 48 provided upon sidewalls 47 of microstructure device feature 54 provide conductive structures 64. In the depicted arrangement, conductive structures 62, 64 form capacitor electrodes of plural capacitors 66. In the described embodiment, conductive structures 62, 64 are provided directly upon sidewalls 47 comprising substrate material 41 of respective ones of microstructure device feature 54 and substrate 40.

In the depicted embodiment of microstructure device 31, microstructure device feature 54 including conductive structures 64 is a capacitive actuator which may be actuated responsive to the application of biasing voltages to one or more of conductive structures 62, 64. In particular, conductive structures 62, 64 are biased during operations to create electrostatic forces that result in movement of end 60 of microstructure device feature 54. The microstructure device feature 54 may be referred to as a capacitive microelectromechanical actuator 68.

Titanium nitride has been shown to deposit conformally on silicon using chemical vapor deposition even though sidewalls 47 comprising silicon in the described embodiment may exhibit a rough surface profile after trenches 46 are formed within substrate 40. The resultant conductive structures 62, 64 upon sidewalls 47 result in a titanium nitride layer having lower surface roughness compared with the prior art processes wherein the roughness or scallops on the surface of the silicon is replicated in subsequent oxide and aluminum layers. Such roughness may degrade the performance of the resultant prior art devices.

Accordingly, in embodiments wherein titanium nitride is utilized, opposing conductive structures 62, 64 of conductive material 48 have substantially smooth outwardly exposed surfaces. Provision of such surfaces is beneficial to improve controllability of conductive structures 62, 64 forming the capacitor electrodes and to improve the functionality of the resultant microstructure device 31 in accordance with the described embodiment.

Titanium nitride is additionally more resistant than aluminum to attack if $SF_6$ plasma silicon release etch chemistry is utilized in processing of assembly 30 depicted in FIG. 20. Utilization of titanium nitride in accordance with aspects of the invention provides conductive structures 62, 64 which are more robust than prior art structures.

Inasmuch as conductive structures 62, 64 upon substrate 40 are conductors, there is no need for aluminum deposition. Direct formation of conductive structures 62, 64 on substrate 40 in accordance with aspects of the invention reduces process complexity by eliminating oxide deposition and etch steps utilized in the prior art processes. In addition, there is no need to open contact windows through an intermediate insulating layer (e.g., layer 12a illustrated in FIG. 5 of the prior art process) inasmuch as conductive material 48 is deposited upon the upper surface 61 of substrate 40. Further, the geometry of the resultant devices 31 of the invention is improved over the prior art devices wherein the formation of additional oxide layers reduces lateral dimensions. In addition, processing according to the present invention eliminates the need for processing following the release step shown in FIG. 20 utilized in the Saif and MacDonald process described above.

What is claimed is:

1. A method of forming a microstructure device comprising:
   forming a monolithic microstructure device feature coupled with a semiconductive substrate;
   providing a conductive structure directly upon at least a portion of the microstructure device feature;
   releasing the microstructure device feature from the semiconductive substrate; and
   wherein the conductive structure comprises at least a portion of a capacitor.

2. The method of forming a microstructure device according to claim 1 wherein the forming and the releasing form the microstructure device feature comprising a cantilevered extension from the semiconductive substrate.

3. The method of forming a microstructure device according to claim 1 wherein the forming comprises forming the microstructure device feature to comprise semiconductive material of the semiconductive substrate.

4. The method of forming a microstructure device according to claim 1 wherein the providing comprises providing the conductive structure upon a sidewall of the microstructure device feature, and further comprising providing another conductive structure directly upon a sidewall of the semiconductive substrate arranged opposite the sidewall of the microstructure device feature to form the capacitor.

5. The method of forming a microstructure device according to claim 1 wherein the providing comprises providing the conductive structure comprising titanium nitride.

6. The method of forming a microstructure device according to claim 1 wherein the providing comprises providing the conductive structure using chemical vapor deposition.

7. The method of forming a microstructure device according to claim 1 wherein the releasing occurs after the providing.

8. A method of forming a microstructure device comprising:
   forming a microstructure device feature coupled with a semiconductive substrate;
   depositing a conductive structure upon at least a portion of the microstructure device feature using chemical vapor deposition;
   releasing at least a portion of the microstructure device feature from the semiconductive substrate; and
   wherein the depositing comprises depositing the conductive structure upon a sidewall of the microstructure device feature, and further comprising depositing another conductive structure using chemical vapor deposition directly upon a sidewall of the semiconductive substrate arranged opposite the sidewall of the microstructure device feature to form a capacitor.

9. The method of forming a microstructure device according to claim 8 wherein the forming comprises forming the microstructure device feature comprising a monolithic structure and wherein the depositing comprises depositing directly upon the monolithic structure.

10. The method of forming a microstructure device according to claim 8 wherein the forming and the releasing provide the microstructure device feature comprising a cantilevered extension from the semiconductive substrate.

11. The method of forming a microstructure device according to claim 8 wherein the forming comprises forming the microstructure device feature to comprise semiconductive material of the semiconductive substrate.

12. The method of forming a microstructure device according to claim 8 wherein the depositing comprises depositing titanium nitride.

13. A method of forming a microstructure device comprising:
    forming a plurality of trenches within a semiconductive substrate to define a microstructure device feature, the semiconductive substrate and the microstructure device feature having opposing sidewalls;
    forming respective conductive structures directly upon respective portions of the opposing sidewalls of the semiconductive substrate and the microstructure device feature;
    undercutting at least a portion of the microstructure device feature to release the portion of the microstructure device feature from the substrate to permit the portion of the microstructure to move relative to the substrate; and
    wherein the forming the respective conductive structures comprises forming the conductive structures to comprise a capacitor.

14. The method of forming a microstructure device according to claim 13 wherein the forming respective conductive structures comprises forming titanium nitride structures.

15. A method of forming a MEMS device comprising:
    providing a semiconductive substrate;
    forming plural trenches having bottom surfaces within the semiconductive substrate to define a MEMS device feature between the trenches, the semiconductive substrate and the microstructure device feature having opposing sidewalls;
    depositing a titanium nitride layer using chemical vapor deposition upon at least a portion of an upper surface of the semiconductive substrate, upon the opposing sidewalls of the semiconductive substrate and the microstructure device feature to form capacitor electrodes, and upon the bottom surfaces;
    removing the titanium nitride layer upon the bottom surfaces of the trenches; and undercutting at least a portion of the microstructure device feature to release the portion of the microstructure device feature from the substrate to permit the portion of the microstructure device feature to move relative to the substrate.

16. The method of forming a microstructure device according to claim 1 wherein the releasing comprises releasing the microstructure device feature having the conductive structure provided directly on the microstructure device feature.

17. The method of forming a microstructure device according to claim 16 wherein the conductive structure comprises titanium nitride having at least one surface outwardly exposed.

18. The method of forming a microstructure device according to claim 1 wherein the providing comprises providing the conductive structure directly upon semiconductor material of the microstructure device feature.

19. The method of forming a microstructure device according to claim 1 wherein the providing comprises providing the conductive structure directly upon bulk semiconductor material of the microstructure device feature.

20. The method of forming a microstructure device according to claim 1 wherein the providing comprises providing the conductive structure directly upon at least the portion of the microstructure device feature comprising a homogeneous structure.

21. The method of forming a microstructure device according to claim 13 wherein the forming the respective conductive structures comprises forming the conductive structures to be substantially electrically insulated from one another.

22. A method of forming a microstructure device comprising:

forming a monolithic microstructure device feature coupled with a semiconductive substrate;

providing a conductive structure directly upon at least a portion of the microstructure device feature;

releasing the microstructure device feature from the semiconductive substrate; and wherein the providing comprises providing the conductive structure upon a sidewall of the microstructure device feature, and further comprising providing another conductive structure directly upon a sidewall of the semiconductive substrate arranged opposite the sidewall of the microstructure device feature to form a capacitor.

* * * * *